(12) United States Patent
Uchino et al.

(10) Patent No.: US 10,831,247 B2
(45) Date of Patent: Nov. 10, 2020

(54) ELECTRONIC APPARATUS

(71) Applicant: LENOVO (SINGAPORE) PTE. LTD., Singapore (SG)

(72) Inventors: Akinori Uchino, Yokohama (JP); Kazuya Tatsuno, Yokohama (JP); Takateru Adachi, Yokohama (JP); Takuroh Kamimura, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/671,467

(22) Filed: Aug. 8, 2017

(65) Prior Publication Data

US 2018/0088637 A1 Mar. 29, 2018

(30) Foreign Application Priority Data

Sep. 23, 2016 (JP) .................................. 2016-185688

(51) Int. Cl.
*G06F 1/20* (2006.01)
*F28D 15/02* (2006.01)
(Continued)

(52) U.S. Cl.
CPC ......... *G06F 1/203* (2013.01); *F28D 15/0275* (2013.01); *F28F 1/20* (2013.01);
(Continued)

(58) Field of Classification Search
CPC .. H05K 7/20; H05K 7/20009; H05K 7/20136; H05K 7/20145; H05K 7/20172;
(Continued)

(56) References Cited

U.S. PATENT DOCUMENTS

| | | | |
|---|---|---|---|
| 6,176,304 B1 * | 1/2001 | Lee ......................... | F28F 3/025 165/185 |
| 6,538,884 B1 * | 3/2003 | Wong .................... | H01L 23/367 165/104.33 |

(Continued)

FOREIGN PATENT DOCUMENTS

| | | | | |
|---|---|---|---|---|
| CN | 2605665 Y | * | 3/2004 | .......... H01L 23/427 |
| CN | 1784804 A | | 6/2006 | |

(Continued)

OTHER PUBLICATIONS

Combine Search and Examination report from UKIPO application No. GB1714314.0 dated Jan. 29, 2018.

(Continued)

*Primary Examiner* — Anatoly Vortman
*Assistant Examiner* — Zhengfu J Feng
(74) *Attorney, Agent, or Firm* — Shimokaji IP

(57) ABSTRACT

There is provided an electronic apparatus that includes a heat radiation unit capable of radiating heat efficiently from a heat pipe. The electronic apparatus includes: a blower fan that blows air toward an exhaust port formed in a main body chassis; a heat radiation fin provided in an air-blowing outlet of the blower fan; and a heat pipe fixed to the heat radiation fin. In a region in contact with the heat pipe, the heat radiation fin is of a partial connection structure in which multiple fin members are partially fixed and connected to one another, and in a region with no contact with the heat pipe, the heat radiation fin is a structure of continuous fins.

5 Claims, 5 Drawing Sheets

(51) Int. Cl.
*F28F 1/20* (2006.01)
*F28F 3/02* (2006.01)
*F28F 7/02* (2006.01)
*G06F 1/16* (2006.01)
*H01L 23/427* (2006.01)
*H05K 7/20* (2006.01)
*F28F 3/06* (2006.01)
*H01L 23/367* (2006.01)
*H01L 23/467* (2006.01)

(52) U.S. Cl.
CPC ............... *F28F 3/025* (2013.01); *F28F 7/02* (2013.01); *G06F 1/16* (2013.01); *H01L 23/427* (2013.01); *H05K 7/20* (2013.01); *F28F 3/06* (2013.01); *H01L 23/3672* (2013.01); *H01L 23/467* (2013.01); *H01L 2924/0002* (2013.01)

(58) Field of Classification Search
CPC ............ H05K 7/20545; H05K 7/20554; G06F 2200/20; G06F 2200/201; G06F 1/20; G06F 1/203; G06F 1/206
USPC ........................................................ 361/695
See application file for complete search history.

(56) References Cited

U.S. PATENT DOCUMENTS

| | | | | |
|---|---|---|---|---|
| 2004/0182552 | A1* | 9/2004 | Kubo | H01L 23/3672 165/104.33 |
| 2007/0086157 | A1* | 4/2007 | Ruch | G06F 1/203 361/679.46 |
| 2008/0074846 | A1* | 3/2008 | Peng | H05K 7/20936 361/715 |
| 2009/0195988 | A1* | 8/2009 | Hongo | G06F 1/203 361/709 |
| 2011/0110042 | A1* | 5/2011 | Zhang | H01L 23/427 361/700 |
| 2012/0097372 | A1 | 4/2012 | Furukawa | |
| 2012/0305221 | A1* | 12/2012 | Huang | F28D 15/0275 165/104.26 |

FOREIGN PATENT DOCUMENTS

| | | | |
|---|---|---|---|
| CN | 201413489 Y | 2/2010 | |
| DE | 20112784 U1 | 11/2001 | |
| JP | H05275582 A | 10/1993 | |
| JP | H088564 A | 1/1996 | |
| JP | 2003179372 A | 6/2003 | |
| JP | 2008199058 A | 8/2008 | |
| JP | 2008263028 A | 10/2008 | |
| JP | 2016024615 A | 2/2016 | |
| JP | 6138939 B2 | 3/2017 | |
| JP | 6138939 B2 * | 5/2017 | ......... H01L 21/4882 |
| JP | 6138939 B2 * | 5/2017 | ......... H01L 21/4882 |
| TW | 376171 | 12/1999 | |
| TW | M243702 | 9/2004 | |
| WO | 2015008326 A1 | 1/2015 | |

OTHER PUBLICATIONS

TW Office Action in counterpart application No. 10720548680 dated Jun. 20, 2018.

* cited by examiner

ELECTRONIC APPARATUS

FIELD OF THE INVENTION

The present invention relates to an electronic apparatus such as a laptop personal computer.

BACKGROUND OF THE INVENTION

In an electronic apparatus such as a laptop personal computer, a cooling fan is provided to remove heat from heat generating components such as a CPU. The cooling fan discharges air to the outside from an exhaust port formed in a wall section inside a chassis of the electronic apparatus (for example, Patent Document 1).

There is known a structure in which a heat radiation unit using a heat transfer plate is provided in an air-blowing outlet of the cooling fan and a heat pipe is fixed to this heat radiation unit. Through the heat pipe, heat absorbed from the heat generating components such as the CPU can be transferred to the heat radiation unit (heat radiation section) to radiate the heat from the heat generating components efficiently.

[Patent Document 1] Japanese Patent Application Laid-Open No. 2016-24615

SUMMARY OF THE INVENTION

However, the heat pipe may not be able to be brought into contact with the entire heat radiation unit due to the restrictions on the internal layout of the electronic apparatus and the like. In this case, part of the heat radiation unit cannot be brought into direct contact with the heat pipe. This disables part of the heat radiation unit from functioning as an effective heat radiation section, and there is a possibility that the cooling performance will be degraded.

The present invention has been made in view of such circumstances, and it is an object thereof to provide an electronic apparatus including a heat radiation unit capable of radiating heat efficiently from a heat pipe.

In order to solve the above problem, an electronic apparatus of the present invention adopts the following components.

An electronic apparatus according to one aspect of the present invention includes: a chassis; a fan installed in the chassis to blow air toward an exhaust port formed in the chassis; a heat radiation unit provided in an air-blowing outlet of the fan; and a heat pipe fixed to the heat radiation unit, wherein in a region in contact with the heat pipe, the heat radiation unit is of a partial connection structure in which multiple fin members are partially fixed and connected to one another, and in a region with no contact with the heat pipe, the heat radiation unit is of a continuous structure as a continuous fin.

The electronic apparatus according to one aspect of the present invention is also such that each of the fin members has a partition wall section and two side wall sections extending respectively from both ends of the partition wall section in a direction approximately orthogonal to the partition wall section, and is formed into an elongated U-shape in cross section, and the fin members are so arranged that the partition wall section of one of the fin members will face both ends of the side wall sections of another adjacent fin member.

The electronic apparatus according to one aspect of the present invention is such that the heat pipe is fixed to one of the side wall sections.

Further, the electronic apparatus according to one aspect of the present invention is such that respective fin members are fixed to each other by a caulking portion formed by partial plastic deformation of a wall section.

Further, the electronic apparatus according to one aspect of the present invention is such that the fin that forms the continuous structure is formed by folding one plate-like body repeatedly.

According to the aspect of the present invention, since the continuous structure as the continuous fin is adopted in the region of the heat radiation unit with no contact with the heat pipe, the thermal conduction of the fin itself can be provided effectively to radiate heat sufficiently. Thus, the cooling performance of the electronic apparatus can be improved.

DETAILED DESCRIPTION OF THE INVENTION

One embodiment of an electronic apparatus according to the present invention will be described below with reference to the accompanying drawings.

Figure 1:
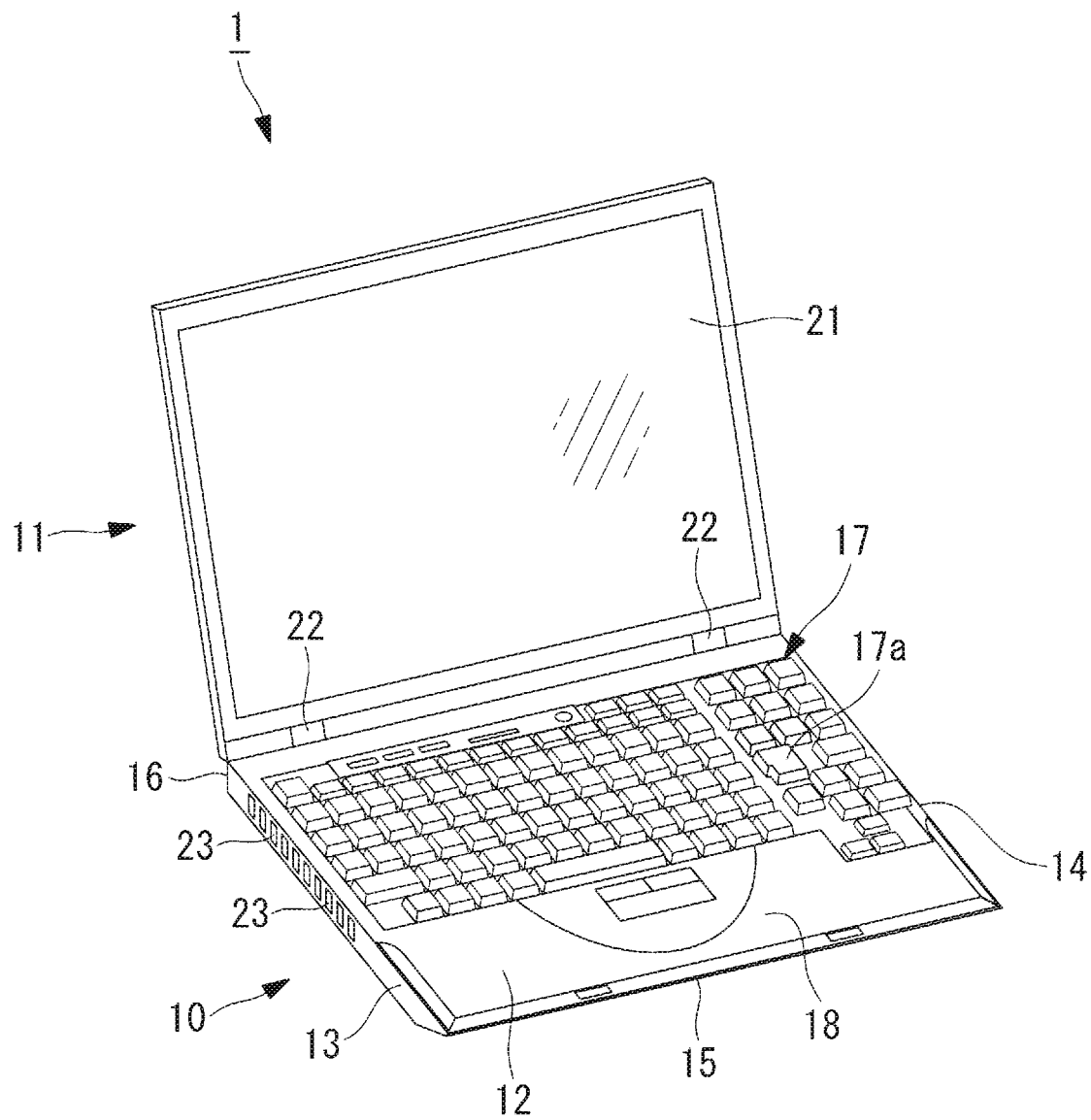
FIG. 1 is a perspective view schematically illustrating a laptop PC according to one embodiment of an electronic apparatus of the present invention.

FIG. 1 illustrates a perspective view of a laptop personal computer (hereinafter simply called the "laptop PC") 1. The laptop PC (electronic apparatus) 1 is a so-called clamshell type laptop PC. The laptop PC 1 includes a main body chassis 10 and a lid body 11.

The main body chassis 10 is a box body composed of an upper face 12, a left side face 13, a right side face 14, a front face 15, a rear face 16, and an unillustrated bottom face. A keyboard 17 is provided on the upper face 12 of the main body chassis 10. Though not illustrated, the keyboard 17 is an input device made up by arranging a membrane switch sheet and multiple keycaps 17a on the upper face of a base member formed from a metal plate. A palm rest 18 is provided in a portion located on the front side of the upper face 12.

The lid body 11 includes a display device 21, such as a liquid crystal display or an organic EL display, on a face opposite to the upper face 12 of the main body chassis 10, and the lower edge of the lid body 11 is supported by hinge parts 22 provided in rear edge portions of the main body chassis 10. When this lid body 11 is opened with respect to the main body chassis 10, the display device 21 is exposed to the front side of the main body chassis 10, and the upper face 12 of the main body chassis 10 is opened up. On the other hand, when the lid body 11 is rotated through the hinge parts 22, the lid body 11 functions as a cover to cover the upper face 12 of the main body chassis 10 and the display device 21 concurrently.

Figure 2:
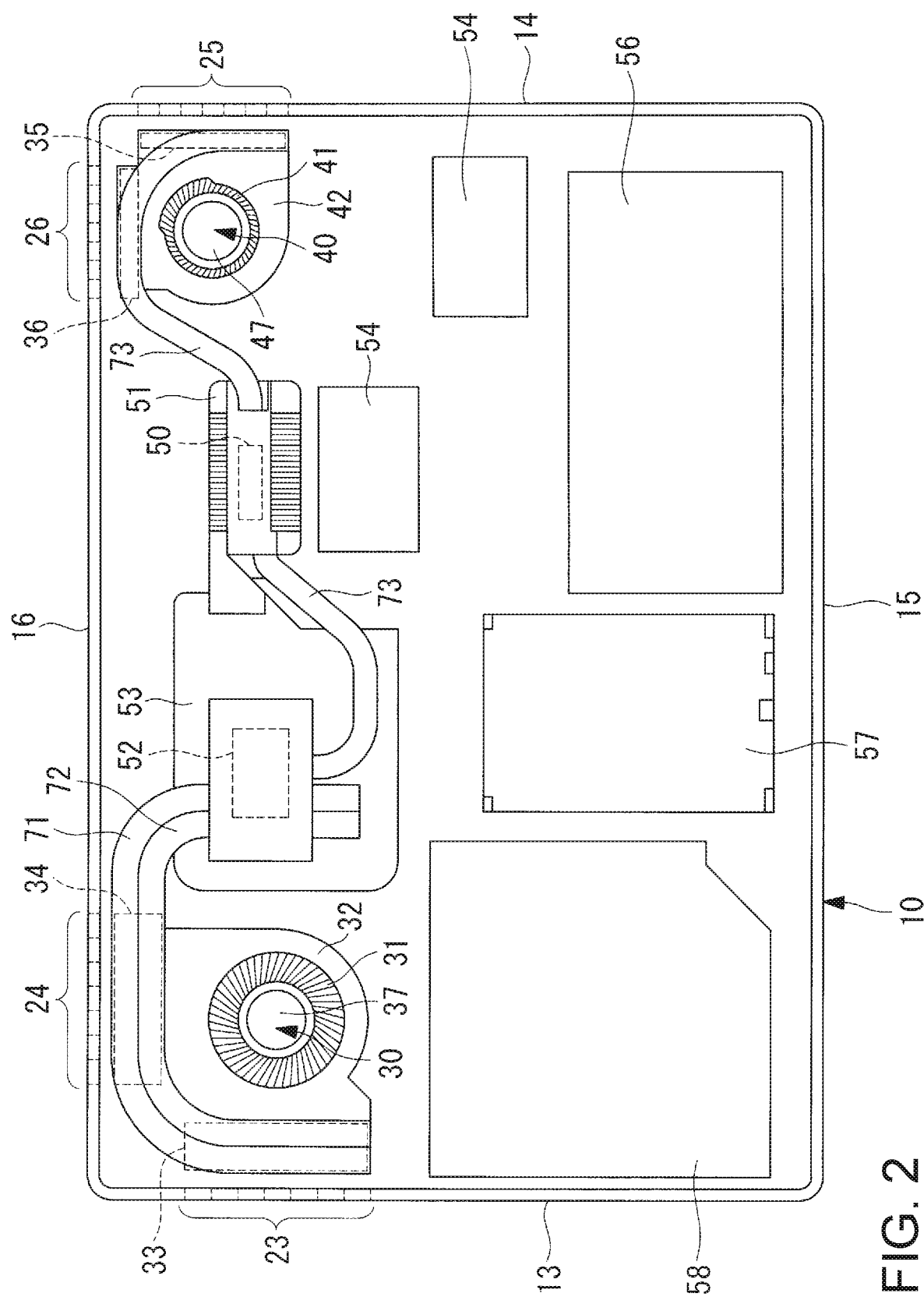
FIG. 2 is a plan view illustrating a configuration inside a main body chassis when a keyboard is removed.

FIG. 2 illustrates a plan view illustrating a configuration inside the main body chassis 10 when the keyboard 17 is removed. Exhaust ports 23, 24 are formed in the left side face 13 and the left side of the rear face 16 of the main body chassis 10, respectively. Exhaust ports 25, 26 are formed in the right side face 14 and the right side of the rear face 16 of the main body chassis 10, respectively. A first blower fan unit 30 is arranged in a left rear corner of the main body chassis 10. A second blower fan unit 40 is arranged in a right rear corner of the main body chassis 10.

The exhaust ports 23, 24, and 25, 26 are long throughholes to discharge, to the outside of the main body chassis 10, air sent respectively from a first blower fan 31 and a second blower fan 41 arranged inside the main body chassis 10. Though not illustrated, air intakes to take outside air into the main body chassis 10 are provided in the upper face 12, the bottom face, and the like of the main body chassis 10. The air taken in the main body chassis 10 is taken into each of the blower fans 31, 41 through the center opening of each of the blower fans 31, 41.

Heat radiation fins (heat radiation units) 33, 34 are arranged in air-blowing outlets on the sides of the exhaust ports 23, 24 of the first blower fan unit 30, respectively. Further, heat radiation fins (heat radiation units) 35, 36 are arranged in air-blowing outlets on the sides of the exhaust ports 25, 26 of the second blower fan unit 40, respectively. The air sent from the first blower fan 31 passes through the intervals between multiple fin members of the heat radiation fin 33 and multiple fin members of the heat radiation fin 34 to remove heat, and is discharged from the exhaust ports 23, 24. Similarly, the air sent from the second blower fan 41 passes through the intervals between multiple fin members of the heat radiation fin 35 and multiple fin members of the heat radiation fin 36 to remove heat, and is discharged from the exhaust ports 25, 26.

As illustrated in FIG. 2, a CPU 50, a heat sink 51 for the CPU 50, a GPU 52, a heat sink 53 for the GPU 52, a memory 54, a battery 56, a hard disk drive 57, an optical drive device 58, and the like are arranged inside the main body chassis 10. Heat pipes 71, 72, and 73 are arranged for the CPU 50 and the GPU 52 as heat generators. The heat pipes 71, 72 are arranged in parallel in such a manner that one end is connected to the side of the GPU 52 and the other end is connected to the heat radiation fins 33, 34 of the first blower fan unit 30. The heat pipe 73 is arranged in such a manner that one end is connected to the side of the GPU 52, the other end is connected to the heat radiation fins 35, 36 of the second blower fan unit 40, and the central portion is connected to the side of the CPU 50. Thus, heat from the GPU 52 is radiated through the heat sink 53, the heat pipes 71, 72, and the heat radiation fins 33, 34. The heat from the GPU 52 is also radiated through the heat sink 53, the heat pipe 73, and the heat radiation fins 35, 36. Further, heat from the CPU 50 is radiated through the heat sink 51, the heat pipe 73, and the heat radiation fins 35, 36, or the heat from the CPU 50 is radiated through the heat sink 51, the heat pipe 73, the heat sink 53, the heat pipes 71, 72, and the heat radiation fins 33, 34.

Each of the heat pipes 71, 72, and 73 is a heat transfer member composed of a pipe made of metal such as copper or aluminum, filled with a working fluid, and provided with a wick around an inner wall.

The blower fan units 30, 40 have the blower fans 31, 41 and fan cases 32, 42 that house the blower fans 31, 41, respectively. The blower fan units 30, 40 are centrifugal fans that rotate the blower fans 31, 41 connected to rotating shafts 37, 47 supported by the fan cases 32, 42 to blow air in the centrifugal direction, respectively.

Figure 3:
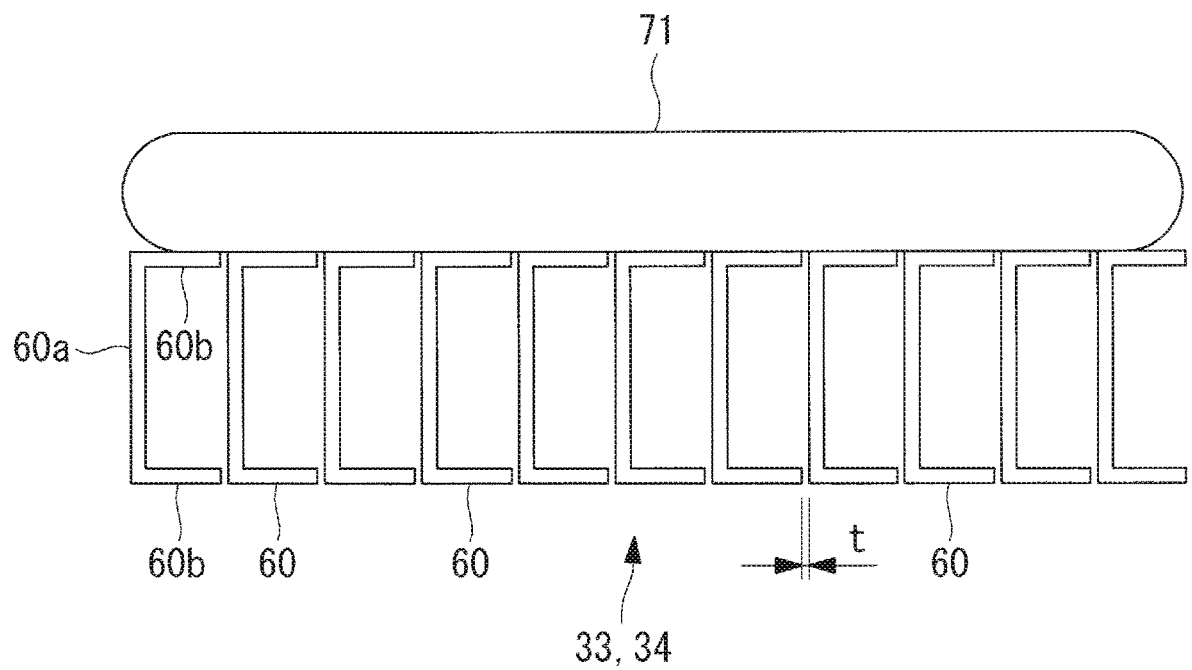
FIG. 3 is a front view illustrating a heat radiation fin with a heat pipe fixed over the entire width of the heat radiation fin.

FIG. 3 illustrates a front view of each of the heat radiation fins 33, 34 of the first blower fan unit 30. The heat radiation fin 33, 34 has the overall shape of a rectangular parallelepiped and is made of a metallic material having high thermal conductivity such as copper or aluminum base alloy. The heat radiation fin 33, 34 is made up of multiple fin members 60 formed into a U-shape in cross section and arranged in parallel and connected to one another.

Each of the fin members 60 has a partition wall section 60a and two side wall sections 60b extending respectively from both ends of the partition wall section 60a in a direction approximately orthogonal to the partition wall section 60a. Thus, the fin member 60 is formed into a U-shape in cross section. The fin members 60 have the same cross section as one another, and are formed into an elongated shape.

The fin members 60 are so arranged that the partition wall section 60a of one fin member 60 will face the ends of both side wall sections 60b, 60b of another adjacent fin member 60. In other words, the fin members 60 are arranged in such a state that the cross section of the U-shape will align in the same direction.

Respective fin members 60 are fixed to each other by a caulking portion formed by partial plastic deformation of one or more wall sections in the longitudinal direction. Thus, the heat radiation fin 33, 34 is of a partial connection structure in which the multiple fin members 60 are partially connected. In FIG. 3, tips of each of the fin members 60, where the caulking portions are not formed, are illustrated, and a clearance gap t is formed between respective fin members 60. Instead of the caulking portion, respective fin members 60 may be partially connected by spot welding.

The heat pipe 71 is fixed to respective upper side wall sections 60b by brazing or welding. As illustrated in FIG. 2, since the heat pipe 71 is provided over the entire width of each of the heat radiation fins 33, 34 of the first blower fan unit 30, each of the fin members 60 can be connected directly to the heat pipe 71, respectively, as illustrated in FIG. 3. Therefore, good thermal conduction between each fin member 60 and the heat pipe 71 is provided.

On the other hand, as illustrated in FIG. 2, the heat pipe 73 is not provided over the entire width of each of the heat radiation fins 35, 36 of the second blower fan unit 40, and one end of each of the heat radiation fins 35, 36 is not in contact with the heat pipe 73. This is derived from restrictions on the layout of the heat pipe 73. For example, the restrictions on the layout of the heat pipe include a case where there is a need to secure a predetermined curvature radius required by the heat pipe, and a case where a restriction is placed on the positional relationship with any other component inside the main body chassis 10.

Figure 4:
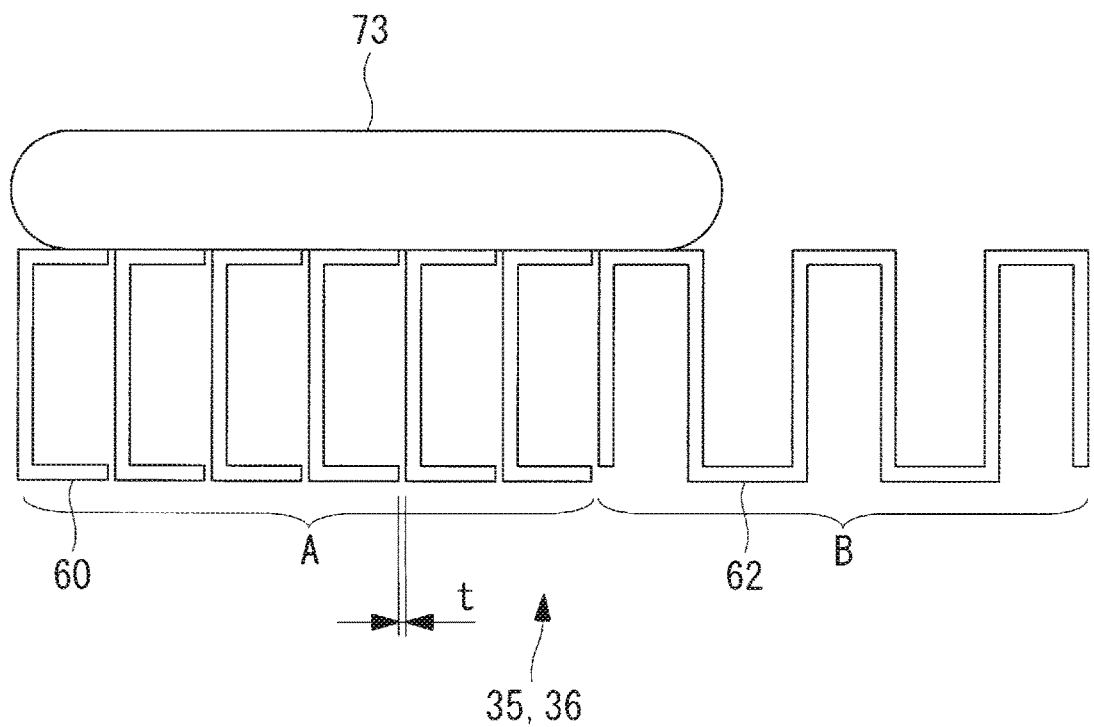
FIG. 4 is a front view illustrating a heat radiation fin with a heat pipe which is not fixed over the entire width of the heat radiation fin.

Like the heat radiation fins 35, 36 of the second blower fan unit 40 in FIG. 2, when the heat pipe 73 cannot be provided over the entire width of each of the heat radiation fins 35, 36, the heat radiation fin 35, 36 having a structure as illustrated in FIG. 4 is adopted.

As illustrated in FIG. 4, in a region A where the heat radiation fin 35, 36 is directly connected to the heat pipe 73, the heat radiation fin 35, 36 has a partial connection structure using the multiple fin members 60 illustrated in FIG. 3. On the other hand, in a region B where the heat radiation fin 35, 36 is not connected directly to the heat pipe 73, the heat radiation fin 35, 36 has a continuous structure formed using a continuous fin 62 continuously formed. Note, however, that one end (left end in FIG. 4) of the continuous fin 62 is connected directly to the heat pipe 73. The continuous fin 62 is formed by folding one continuous metal plate (plate-like body) repeatedly by drawing or pressing.

According to the present embodiment, the above structure has the effects mentioned below. As illustrated in FIG. 4, in the region A where the heat pipe 73 is in contact with the heat radiation fin 35, 36, since each fin member 60 can be fixed to the heat pipe 73, a region capable of radiating heat effectively can be formed by partially fixing respective fin members 60. Thus, in the region A where the heat radiation fin 35, 36 is in direct contact with the heat pipe 73, the partial connection structure in which the multiple fin members 60 are partially fixed by the caulking portions and connected to one another is adopted to be able to construct a heat radiation unit easily.

However, since the fin members 60 are partially connected in the partial connection structure using the fin members 60, there is the clearance gap t between the fin members 60, and hence there is a possibility that the thermal conduction between the fin members 60 will not be sufficient. When the heat pipe 73 is fixed to each fin member 60, since heat is conducted between the fin members 60 through the heat pipe 73, there is no need to take into account the thermal conduction between the fin members 60.

Figure 5:
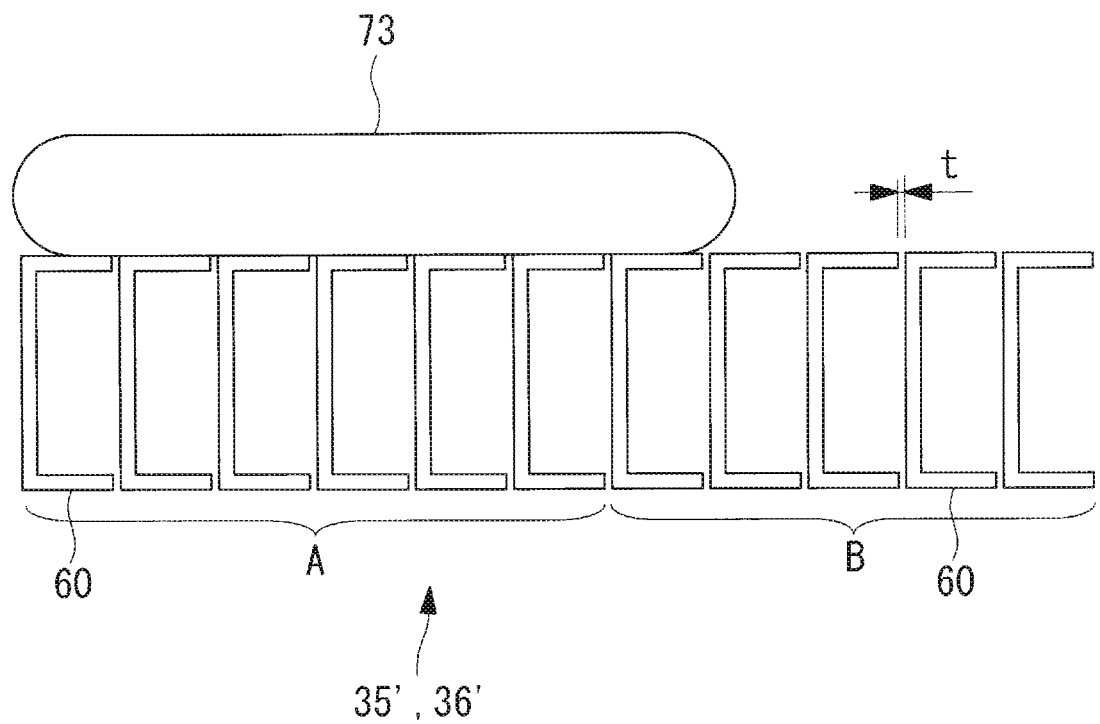
FIG. 5 is a front view of a heat radiation fin illustrated as a comparison example to FIG. 4.

On the other hand, as illustrated in FIG. 5 as a comparison example, when an overall heat radiation fin 35', 36' is made up of fin members 60 as a partial connection structure, since heat cannot be conducted by direct thermal conduction from the heat pipe 73 to each fin member 60 in the region B with no contact with the heat pipe 73, there is a possibility that heat cannot be radiated effectively in the region B.

Therefore, in the heat radiation fin 35, 36 of the embodiment, the continuous structure using the continuous fin 62 is adopted in the region B with no contact with the heat pipe 73 to provide effective thermal conduction of the fin itself to radiate heat sufficiently.

Thus, the heat radiation fin 35, 36 is made up of a combination of the partial connection structure and the continuous structure to be able to realize a heat radiation unit with a simple structure and excellent radiation performance.

Further, since the continuous fin 62 is formed by folding one metal plate repeatedly, such a structure that the thermal conduction of the fin itself is good can be formed easily.

The continuous fin 62 may be modified as follows.

Figure 6:
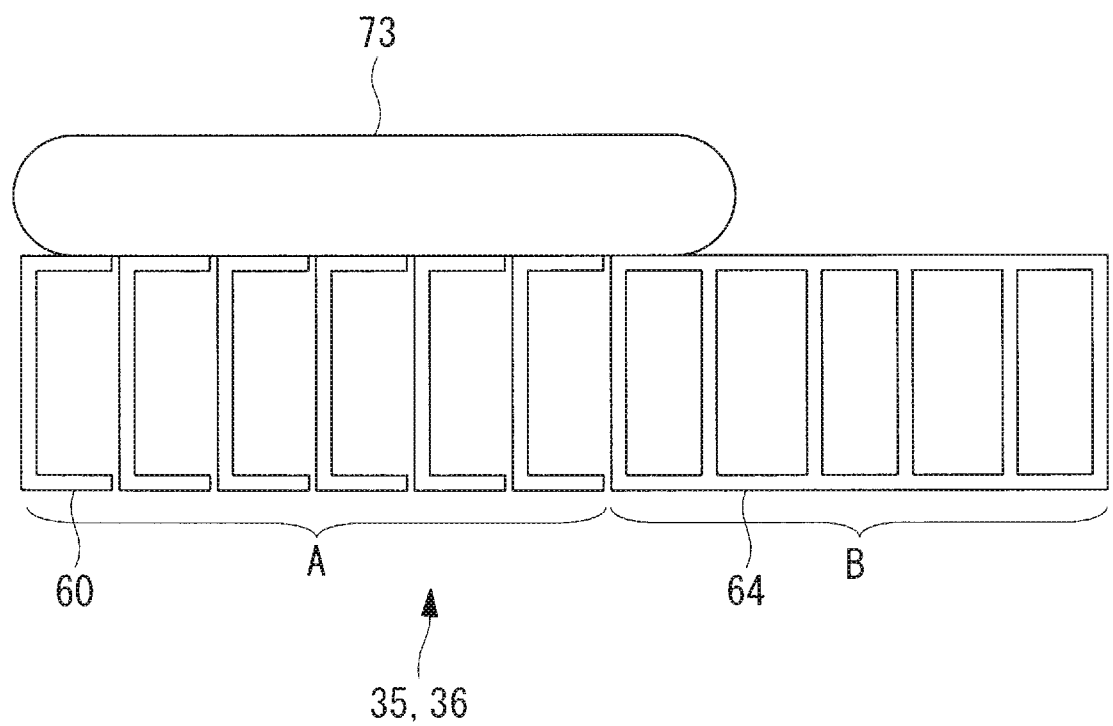
FIG. 6 is a front view of a heat radiation fin as a first variation of a continuous fin.

As illustrated in FIG. 6, a continuous fin 64 in which multiple flow paths are formed in parallel in a series of wall sections is formed by extrusion molding. Even in such a continuous fin 64, since the wall sections are continuously connected, the thermal conductivity of the fin itself can be increased to improve the radiation performance of the region B with no contact with the heat pipe 73.

Figure 7:
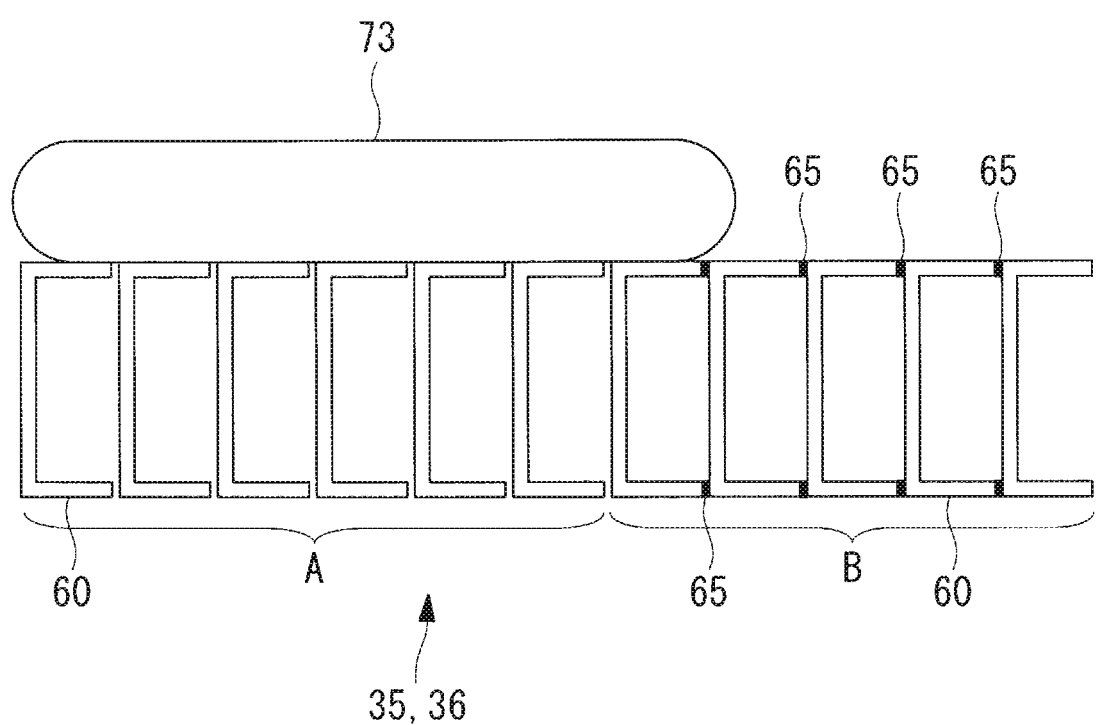
FIG. 7 is a front view of a heat radiation fin as a second variation of the continuous fin.

Alternatively, as illustrated in FIG. 7, multiple fin members 60 are also used in the region B with no contact with the heat pipe 73 in such a manner that adjacent fin members 60 are connected by a weld 65. The weld 65 is continuously provided throughout the fin members 60 in the longitudinal direction to bridge the clearance gap between the fin members 60. Thus, since the continuous weld 65 is provided in the longitudinal direction to connect respective fin members 60, the thermal conductivity between the fin members 60 can be increased to improve the radiation performance of the region B with no contact with the heat pipe 73. Any other measure may be taken instead of the weld 65 as long as the measure fixes the fin members 60 in the longitudinal direction. For example, a caulking portion continuous in the longitudinal direction may also be used.

Although the laptop PC 1 is used as an example of the electronic apparatus in the embodiment to describe the present invention, the present invention is not limited thereto. For example, the present invention can also be applied to any other electronic apparatus such as a tablet.

We claim:

1. An electronic apparatus comprising:
    a chassis;
    a fan installed in the chassis to blow air toward an exhaust port formed in the chassis;
    a heat radiation unit in an air blowing outlet of the fan, the heat radiation unit comprising a plurality of fin members and a plurality of fin elements arranged in a first direction along a heat pipe; and
    the heat pipe fixed to and overlaying the heat radiation unit,
        wherein, in a first region of the heat radiation unit that is in direct contact with the heat pipe, the heat radiation unit has a partial connection structure in which each of the plurality of fin members are all partially fixed and connected to one another, and
        wherein, in a second region, of the heat radiation unit, that has a first portion in no direct contact with the heat pipe, and a second portion in direct contact with the heat pipe, and the second region is entirely positioned next to the first region in the first direction, the heat radiation unit has a structure of one continuous fin;
        wherein the continuous fin includes the plurality of fin elements all completely connected in series;
        wherein only one of the plurality of completely connected fin elements directly contacts the heat pipe and all other fin elements are completely free of direct contact with any other component of the electronic apparatus;
        wherein the first portion of the second region of the heat radiation unit extends, in the first direction, beyond one side of the heat pipe in a width direction of the heat pipe whereby the first portion is completely free of direct contact with other components of the electronic apparatus;
        wherein the width direction is parallel to the first direction;
        wherein one end of the first region of the heat radiation unit immediately adjacent the second portion of the second region of the heat radiation unit is not aligned with the one side of the heat pipe in the width direction;
        wherein another end of the first region of the heat radiation unit which is opposite the one end of the first region aligns, in the first direction, with another side of the heat pipe, in the width direction, which is opposite the one side of the heat pipe in the width direction.

2. The electronic apparatus according to claim 1, wherein:
    the partially connected fin members are arranged such that a partition wall section of one of the partially connected fin members faces both ends of side wall sections of another adjacent partially connected fin member.

3. The electronic apparatus according to claim 2, wherein the heat pipe is fixed to one of the side wall sections.

4. The electronic apparatus according to claim 1, wherein respective partially connected fin members are fixed to each other by a caulking portion formed by a partial plastic deformation of a wall section.

5. The electronic apparatus according to claim 1, wherein the continuous fin is formed by folding one continuous plate-like body repeatedly.

\* \* \* \* \*